United States Patent
Kulkarni et al.

(10) Patent No.: US 10,892,768 B2
(45) Date of Patent: Jan. 12, 2021

(54) LOW NOISE AND LOW DISTORTION TEST METHOD AND SYSTEM FOR ANALOG-TO-DIGITAL CONVERTERS

(71) Applicant: Texas Instruments Incorporated, Dallas, TX (US)

(72) Inventors: Rahul Vijay Kulkarni, Pune (IN); Siva Reddy Vemireddy, Andra Pradesh (IN); Sharat Chandra Rudrasamudram, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 593 days.

(21) Appl. No.: 15/700,379

(22) Filed: Sep. 11, 2017

(65) Prior Publication Data

US 2019/0081634 A1    Mar. 14, 2019

(51) Int. Cl.
*H03M 1/10* (2006.01)
*H03M 1/12* (2006.01)

(52) U.S. Cl.
CPC ....... *H03M 1/1071* (2013.01); *H03M 1/1085* (2013.01); *H03M 1/1095* (2013.01); *H03M 1/12* (2013.01)

(58) Field of Classification Search
CPC ............. H03M 1/1071; H03M 1/1085; H03M 1/1095; H03M 1/12
See application file for complete search history.

(56) References Cited

U.S. PATENT DOCUMENTS

| | | | |
|---|---|---|---|
| 2011/0231153 A1* | 9/2011 | Hamilton | H03M 1/109 702/180 |
| 2016/0211861 A1* | 7/2016 | Op 't Eynde | H03M 1/1038 |
| 2016/0352347 A1* | 12/2016 | Fernando | H03M 1/1009 |
| 2018/0063457 A1* | 3/2018 | Shimamura | H04N 5/3698 |

OTHER PUBLICATIONS

Chang et al., "Background Adaptive Cancellation of Digital Switching Noise in a Pipelined Analog-to-Digital Converter Without Noise Sensors," in IEEE Journal of Solid-State Circuits, vol. 49, No. 6, pp. 1397-1407, Jun. 2014.*

* cited by examiner

*Primary Examiner* — Catherine T. Rastovski
(74) *Attorney, Agent, or Firm* — Ronald O. Neerings; Charles A. Brill; Frank D. Cimino (57) ABSTRACT

Disclosed examples include a method and automated test system for testing an ADC. The method includes computing an ADC noise value based on a first set of data values sampled while the ADC input terminals are shorted, computing a first system noise value based on a second set of data values sampled while a test circuit signal source applies zero volts to the ADC through a signal chain, computing a signal chain noise value based on the first system noise value and the ADC noise value, computing a measured SNR value based on a third set of data values sampled while the test circuit signal source applies a non-zero source voltage signal to the signal chain, computing a second system noise value based on the measured SNR value, and computing an ADC SNR value based on the second system noise value and the signal chain noise value.

20 Claims, 6 Drawing Sheets

LOW NOISE AND LOW DISTORTION TEST METHOD AND SYSTEM FOR ANALOG-TO-DIGITAL CONVERTERS

BACKGROUND

Analog-to-digital converters (ADC) are used in many modern electrical systems to provide a digital value representing a sampled input signal. During manufacturing, ADCs are tested to evaluate noise performance in terms of signal-to-noise ratio (SNR), as well as to characterize integral non-linearity (INL) to ensure that the ADC will operate properly. INL performance is related to settling time of a test system, and there is a trade-off between fast settling time and low noise for the test system. Current systems used two separate circuits for testing high-performance ADC noise and integral non-linearity. This increases the testing time for a given manufactured ADC, because each part requires two insertions of the ADC. First insertion into a low noise test circuit to evaluate SNR performance, and a second insertion into a fast settling-time test circuit to evaluate INL performance.

SUMMARY

Disclosed examples provide simplified techniques for testing ADC noise performance. Systems and methods for testing ADCs are presented using an approach with three modes. In certain examples, the method includes receiving a first set of data values sampled when first and second ADC input terminals are connected to one another. The method further includes receiving a second set of data values sampled by the ADC while the ADC input terminals are connected to a test circuit signal chain of a test circuit and a test circuit signal source applies a zero volt source voltage signal to the test circuit signal chain. The method further includes receiving a third set of data values sampled by the ADC while the first and second ADC input terminals are connected to the test circuit signal chain and the test circuit signal source applies a full scale source voltage signal to the test circuit signal chain. The method further includes computing an ADC SNR value that represents a noise performance of the ADC based on the first, second, and third sets of data values.

In some examples, the method further includes actuating the test circuit to connect the first and second ADC input terminals to one another. In some examples, the method further includes actuating the ADC to sample the input signal while the first and second ADC input terminals are connected to one another, and receiving the first set of data values from the ADC. In some examples, the method further includes computing an ADC noise value based on the first set of data values. In some examples, the method further includes actuating the test circuit to connect the ADC input to a test circuit signal chain of the test circuit, and setting the test circuit signal source to apply the zero volt source voltage signal to the signal chain. In some examples, the method further includes actuating the ADC to sample the input signal while the test circuit signal source applies zero volts to the signal chain, and receiving the second set of data values from the ADC. In some examples, the method further includes computing the first system noise value based on the second set of data values. In some examples, the method further includes computing a signal chain noise value based on the first system noise value and the ADC noise value. In some examples, the method further includes actuating the test circuit signal source to apply the non-zero full scale source voltage signal to the signal chain while the first and second ADC input terminals are connected to the signal chain. In some examples, the method further includes actuating the ADC to sample the input signal while the test circuit signal source applies the non-zero full scale source voltage signal to the signal chain, and receiving the third set of data values from the ADC. In some examples, the method further includes computing a measured SNR value based on the third set of data values. In some examples, the method further includes computing a second system noise value based on the measured SNR value. In some examples, the method further includes computing the ADC SNR value based on the second system noise value and the signal chain noise value.

In some examples, the method further includes that the ADC noise value is computed as a standard deviation of the first set of data values; and that the first system noise value is computed as a standard deviation of the second set of data values. In some examples, the method further includes that the second system noise value is computed based on using an ADC code range. In some examples, the method further includes that the ADC SNR value is computed based on a square root of a difference between a square of the signal chain noise value and a square of the second system noise value. In some examples, the method further includes that the measured SNR value includes performing a Fast Fourier Transform on the third set of data values. In some examples, the method further includes that the signal chain noise value is computed as a square root of a difference between a square of the ADC noise value and a square of the first system noise value.

An automated test system for testing a connected ADC is also provided, the ADC including an input with a first ADC input terminal and a second ADC input terminal to receive an input signal. The system includes a test circuit. The test circuit includes a test circuit signal source, including first and second signal source outputs to provide a source voltage signal according to a signal source control signal. The test circuit further includes a signal chain circuit. The signal chain includes a signal chain input to receive the source voltage signal from the test circuit signal source, the signal chain input including a first signal chain input node connected to the first signal source output, and a second signal chain input node connected to the second signal source output. The signal chain further includes a signal chain output to provide a signal chain output signal, the signal chain output including a first signal chain output node. The test circuit further includes a second signal chain output node. The test circuit further includes a switch circuit coupled with the signal chain output and with the input of the ADC, the switch circuit operative in a first state to connect the first and second ADC input terminals to one another, and in a second state to connect the signal chain output to the input of the ADC to provide the signal chain output signal to the first and second ADC input terminals. In certain implementations, the system further includes a host system. The host system includes a processor configured to, in a first test mode, provide a switch control signal to place the switch circuit in the first state, provide a convert control signal to cause the ADC to sample and convert the input signal while the switch circuit is in the first state, receive a corresponding first set of data values from the ADC, and compute an ADC noise value based on the first set of data values. In certain implementations, the processor is further configured to, in a second test mode, provide the switch control signal to place the switch circuit in the second state, provide the signal source control signal to cause the test circuit signal source to provide the source voltage signal to the signal chain circuit at zero volts, provide the convert control signal to cause the ADC to sample and convert the input signal while the test circuit signal source provides the source voltage signal to the signal chain circuit at zero volts, receive a corresponding second set of data values from the ADC, and compute a first system noise value based on the second set of data values. In certain implementations, the processor is further configured to compute a signal chain noise value based on the first system noise value and the ADC noise value. In certain implementations, the processor is further configured to in a third test mode, provide the source control signal to cause the test circuit signal source to provide the source voltage signal to the signal chain circuit as a non-zero full scale sine wave voltage signal while the switch circuit is in the second state, provide the convert control signal to cause the ADC to sample and convert the input signal while the test circuit signal source provides the source voltage signal to the signal chain circuit as the non-zero full scale sine wave voltage signal, receive a corresponding third set of data values from the ADC, and compute a measured signal to noise ratio value based on the third set of data values. In certain implementations, the processor is further configured to compute a second system noise value based on the measured SNR value. In certain implementations, the processor is further configured to compute an ADC SNR value that represents a noise performance of the ADC based on the second system noise value and the signal chain noise value.

In some examples, the processor computes the ADC noise value as a standard deviation of the first set of data values. In some examples, the processor computes the first system noise value as a standard deviation of the second set of data values. In some examples, the processor computes the second system noise value based on using an ADC code range. In some examples, the processor computes the ADC SNR value based on a square root of a difference between a square of the signal chain noise value and a square of the second system noise value. In some examples, the measured SNR value includes performing a Fast Fourier Transform on the third set of data values. In some examples, the signal chain noise value is computed as a square root of a difference between a square of the ADC noise value and a square of the first system noise value.

In another embodiment, a method of individually testing ADCs is provided. The ADCs include a input with a first ADC input terminal, and a second ADC input terminal to receive an input signal. The method includes, for a plurality of ADCs, connecting the first and second ADC input terminals to one another. The method includes computing an ADC noise value based on a first set of data values corresponding to the ADC sampling the input signal while the first and second ADC input terminals are connected to one another. The method includes connecting the first and second ADC input terminals to a test circuit signal chain, and setting a test circuit signal source to apply a zero volt source voltage signal to the signal chain. The method includes computing, by the processor, a first system noise value based on a second set of data values corresponding to the ADC sampling the input signal while the test circuit signal source applies the zero volt source voltage signal to the signal chain. The method includes computing, by the processor, a signal chain noise value based on the first system noise value and the ADC noise value. The method includes setting the test circuit signal source to apply a non-zero voltage signal to the signal chain. The method includes computing, by the processor, a measured signal to noise ratio (SNR) value based on a third set of data values corresponding to the ADC sampling the input signal while the test circuit signal source applies the non-zero voltage signal to the signal chain. The method includes computing, by the processor, a second system noise value based on the measured SNR value. The method includes using the processor, computing an ADC SNR value that represents a noise performance of the ADC based on the second system noise value and the signal chain noise value. In some examples, the method includes, for the plurality of ADCs, using the processor, setting the test circuit signal source to apply a non-zero full scale sine wave voltage signal to the signal chain while the first and second ADC input terminals are connected to the signal chain, and includes that the third set of data values corresponds to a sample and conversion of the input signal done while the test circuit signal source applies the full scale sine wave voltage signal to the signal chain.

In some examples, the method includes, for the plurality of ADCs, that the ADC noise value is computed as a standard deviation of the first set of data values; and that the first system noise value is computed as a standard deviation of the second set of data values. In some examples, the method includes, for the plurality of ADCs, that the second system noise value is computed based on using an ADC code range. In some examples, the method includes, for the plurality of ADCs, that the ADC SNR value is computed based on a square root of a difference between a square of the signal chain noise value and a square of the second system noise value. In some examples, the method includes, for the plurality of ADCs, that the measured SNR value includes performing a Fast Fourier Transform on the third set of data values. In some examples, the method includes, for the plurality of ADCs, that the signal chain noise value is computed as a square root of a difference between a square of the ADC noise value and a square of the first system noise value.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 1:
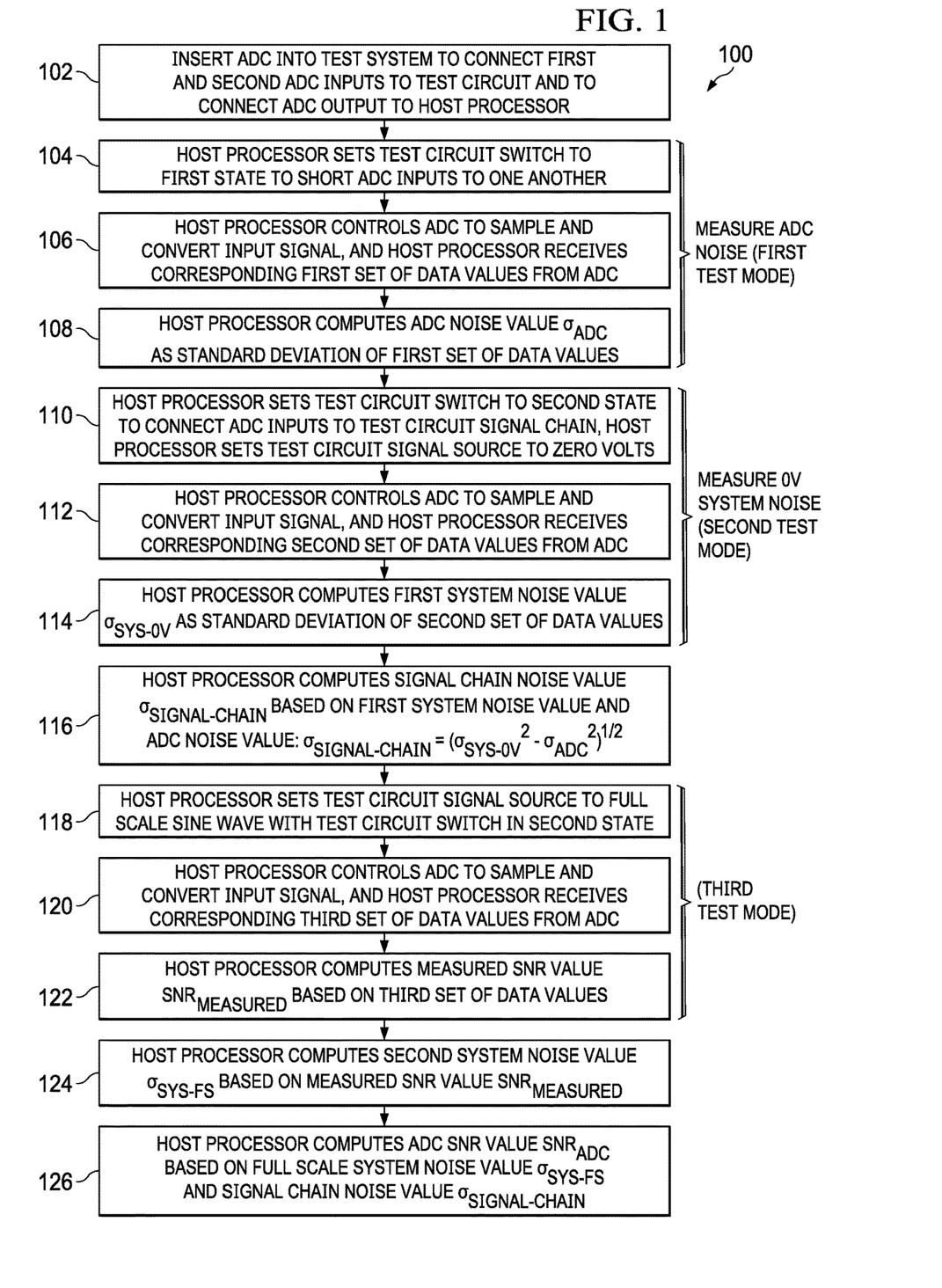
FIG. 1 is a flow diagram of a method for testing ADCs.
Figure 2:
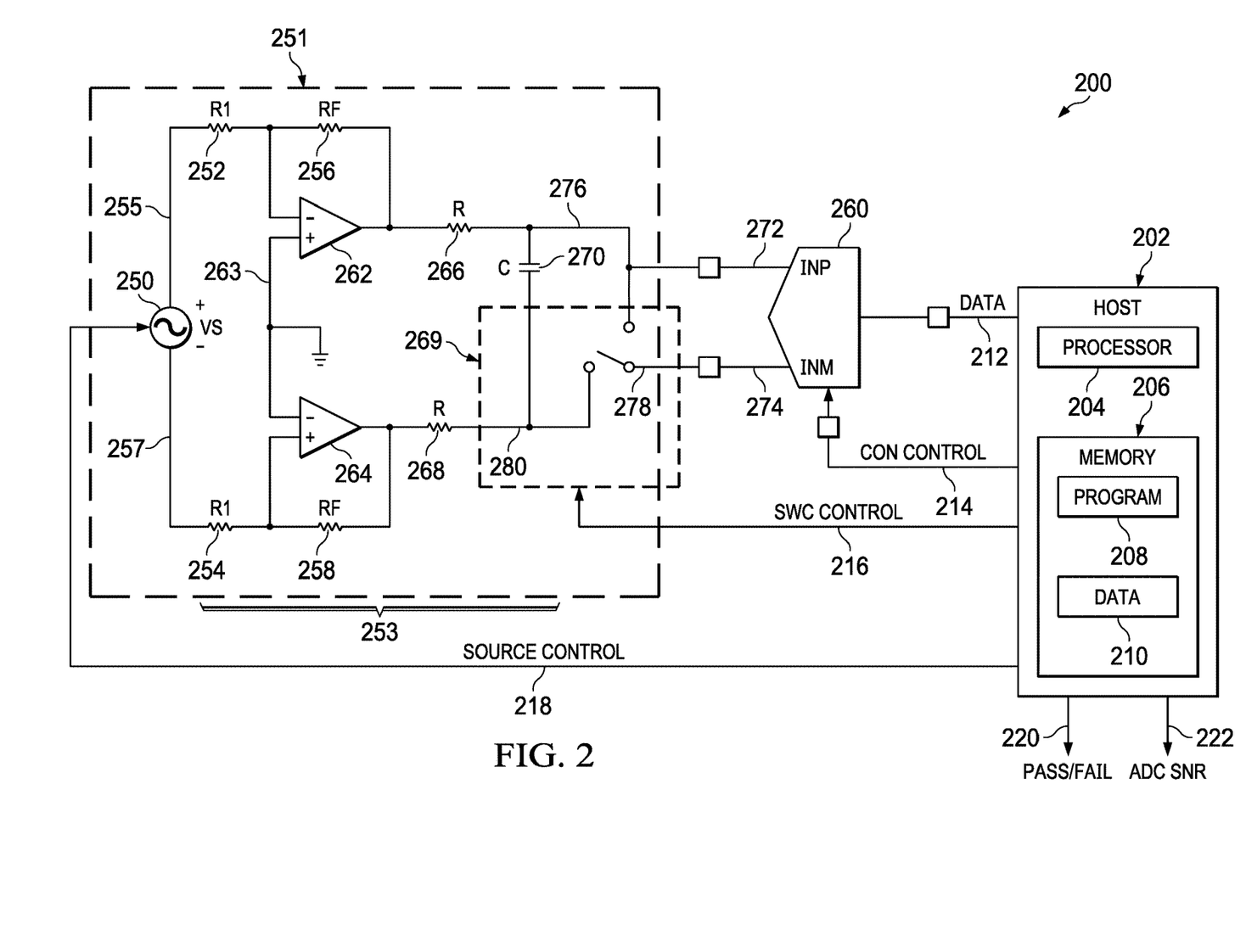
FIG. 2 is a schematic diagram of an automated test system including a switch capable of being switched between a first state and a second state.

Referring initially to FIGS. 1 and 2, FIG. 1 illustrates a non-limiting example method 100 of testing an ADC that can be implemented by a processor 204 in an automated test system 200 of FIG. 2. The ADC 260 includes an input. The ADC input in one example is a differential input. In other examples, the ADC input is a pseudo-differential input or a single ended input. The ADC input includes a first ADC input terminal 272 and a second ADC input terminal 274 to receive an input signal, such as a differential input signal INP, INM. In other examples, the ADC input receives a single-ended or pseudo-differential input signal. In various configurations of the test system 200, the input signal is provided to the ADC input from a test circuit signal source 250 though signal chain 253. FIG. 2 shows a differential signal chain circuit 253. In other examples, the signal chain circuit 253 is a single ended circuit (not shown), and the circuit can include ground or reference node connections for the second ADC input. The system 200 of FIG. 2 can be used to test a variety of different types and forms of ADC, for example, a 20-bit successive approximation register (SAR) ADC. The method 100 in one example is implemented by a processor 204 of a host system 202 by exchanging signals with a currently tested ADC 260 and a test circuit 251. The example method 100 includes a first test mode (e.g., at 104, 106 and 108 in FIG. 1), a second test mode (e.g., 110, 112 and 114), and a third test mode (118, 120 and 122). Based on measurements taken during these three test modes, the method 100 provides a computed ADC signal-to-noise ratio value $SNR_{ADC}$ representing noise performance of the ADC 260 device under test (DUT). The method 100, including the three test modes, is then repeated for a subsequently tested ADC 260.

FIG. 2 shows an automated test system 200 for testing the ADC 260. The ADC 260 is connectable to test circuit 251 through the first ADC input terminal 272 and the second ADC input terminal 274. In this example, the first ADC input terminal 272 is connectable to a first signal chain output node 276, and the second ADC input terminal 274 is connectable to a second signal chain output node 280. A switch connecting node 278 connects the test circuit 251 to the ADC 260. The automated test system 200 of FIG. 2 includes a host system 202 with a processor 204 and an associated memory 206. In one example, the processor 204 implements or executes a control program to a weight stored in the memory 206, including obtaining and computing one or more data values 210 stored in the memory 206. The host system 202 includes a data input connection 212 to receive converted data values or signals (DATA) from a tested ADC 260. In one example, the data input connection 212 is a single electrical connection to provide serial transfer of the data signal DATA from the tested ADC converter 260. In another non-limiting example, the data input connection 212 includes multiple connections to provide parallel data transfer from a tested ADC 260 to the host system 202. The host system 202 also includes a conversion control output connection 214 to provide a convert control signal CON CONTROL to the tested ADC 260, as well as a test circuit control output connection 216 to provide a switch control signal SWC CONTROL to a switch circuit 269 of the test circuit 251. The switch 269 may be placed in the first state, which is used for a first test mode. In the first state, the switch 269 connects the first and second ADC input terminals 272, 274 to one another (e.g., shorts the first and second ADC input terminals 272, 274). The switch 269 may also be placed in the second state, which is used for second and third test modes. In the second state, the switch 269 connects the first and second ADC input terminals 272, 274 to the test circuit signal chain 253 of the test circuit 251.

The host system 202 also includes an output connection 218 to provide a signal source control signal SOURCE CONTROL to a test circuit signal source 250 of the test circuit 251. The host system 202 provides a signal PASS/FAIL via an output 220 to indicate whether the ADC 260 under test has an acceptable noise performance, and also provides an ADC SNR signal at an output 222 to indicate the measured SNR performance of the ADC 260 under test. The host system 202 in various examples can provide the outputs 220, 222 and the associated signals PASS/FAIL, ADC SNR as communications messaging to another computer system (not shown), or can provide the signals or values to a user interface or any other suitable external system by which a given device under test can be deemed as acceptable or not, and a specific performance parameter of the tested device can be provided.

The host system 202 and the device under test interface with the test circuit 251 to implement multi-mode testing of a connected ADC 260. The test circuit 251 includes the switch circuit 269 operating according to the switch control signal from the host circuit output 216 in order to selectively connect the ADC input terminals to 272, 274 of the connected ADC 260 to one another, or to connect the ADC input to receive a differential signal from a signal chain circuit 253. The signal chain circuit 253 includes a differential input with first and second signal chain input nodes 255 and 257 that receive a differential source voltage signal VS from the test circuit signal source 250.

The source 250 provides the differential source voltage signal VS according to the SOURCE CONTROL signal from the host circuit output 218. The host system processor 204, in some implementations, executes program instructions 208 in the memory 206 to perform the method 100 of FIG. 1. In operation, the host system 202 provides the convert control signal CON CONTROL 214 to the ADC 260 to cause the ADC 260 to sample and convert the differential, single-ended or pseudo-differential input signal INP, INM. The ADC 260 provides the resulting converted data values DATA via the host system connection 212 to the host system 202 for use by the host processor 204 to compute noise values and SNR values. The host processor 204 also provides the switch control signal SWC CONTROL at the output 216 to control the switch circuit 269 in different states according to a test mode. The host processor 204 indicates a pass/fail of the ADC 260 with pass/fail signal PASS/FAIL via an output 220, and also indicates SNR values by providing the ADC SNR signal at the output 222.

The first signal chain input node 255 is connected through an upper first resistor 252 (R1) to an inverting (+) input of an upper amplifier 262, and an upper feedback resistor 256 (RF) is connected between the inverting input (−) of the amplifier 262 and an output of the amplifier 262. A non-inverting input of the upper amplifier 262 is connected to a common or reference node 263. The second signal chain input node 257 is similarly coupled through a lower first resistor 254 (R1) to a non-inverting input (+) of a lower amplifier 264, and a lower feedback resistor 258 (RF) is connected between the lower amplifier non-inverting input and an output of the amplifier 264. The inverting (−) input of the lower amplifier 264 is connected to the non-inverting input of the upper amplifier 262 at the reference node 263. The upper and lower amplifier outputs are coupled through respective upper and lower resistors (R) 266 and 268 to corresponding signal chain output nodes 276 and 280. A test circuit output capacitor 270 is connected between the circuit nodes 276 and 280. With the switch circuit 269 in the second state, the signal chain 253 provides the voltage signal VS from the test circuit signal source 250 to the first and second ADC input terminals 272, 274. As discussed below in connection with FIG. 3, however, the signal chain 253 has noise. The presently disclosed concepts account for the signal chain noise when testing the ADC 260. In some implementations, the differential source voltage signal VS is sent from the test circuit signal source 250 to the first and second signal source outputs 255, 257 (also referred to as the first and second signal chain input nodes 255, 257). In the implementation of FIG. 2, the signal chain 253 includes first through sixth resistors 252, 254, 256, 258, 266 and 268, as well as first and second operational amplifiers (op-amps) 262 and 264 and a capacitor 270 (C).

The circuit node 276 in this example is connected to the first ADC input terminal 272 by the system socket connection for the tested ADC 260. The lower circuit node 280 is connected to the switching circuit 269, which selectively connects the second ADC input terminal 274 to either the first ADC input terminal 272 or to the signal chain output node 280. In this configuration, a first switching state of the switching circuit 269 shorts the ADC input terminals 272, 274 together, and a second switching state of the circuit 269 connects the ADC input terminals 272, 274 to receive a differential, single-ended or pseudo-differential input signal INP, INM from the signal chain circuit 253.

The example test method 100 of FIG. 1 begins at 102, where an ADC 260 is inserted into the test system 200 of FIG. 2, for example, by insertion of the currently tested ADC 260 into a test fixture or socket having electrical connections for the ADC input terminals to 272, 274, connections for interfacing a data output of the tested ADC 260 with the host system 202, connections for a conversion control input signal from the host system 202, as well as connections to provide power to the ADC 260. In the example of FIG. 2, the test fixture includes socket connections to connect the first and second ADC input terminals 272, 274 to the test circuit 251, as well as a single socket connection to connect a serial ADC output terminal to the host processor 204. At 104, the processor 204 actuates (e.g., enables or otherwise causes) the test circuit 251 to connect the first and second ADC input terminals 272, 274 to one another. At 106, the processor 204 actuates the ADC 260 to sample and convert the differential, single-ended or pseudo-differential input signal INP, INM while the first and second ADC input terminals 272, 274 are connected to one another, and receives a corresponding first set of data values from the ADC 260. At 108, the processor 204 computes an ADC noise value ($\sigma_{ADC}$) based on the first set of data values. At 110, the processor 204 actuates the test circuit 251 to connect the first and second ADC input terminals 272, 274 to a test circuit signal chain 253 of the test circuit 251, and sets the test circuit signal source 250 to apply a zero volt source signal to the signal chain 253. The applied zero volt source signal is an output corresponding to a zero voltage command input to the signal source 250, which may but need not be actually zero. At 112, the processor 204 actuates (e.g., enables or otherwise causes) the ADC 260 to sample and convert the differential, single-ended or pseudo-differential input signal INP, INM while the test circuit signal source 250 applies zero volts to the signal chain 253, and receives a corresponding second set of data values from the ADC 260. At 114, the processor 204 computes a first system noise value ($\sigma_{SYS-0V}$) based on the second set of data values. At 116, the processor 204 computes a signal chain noise value ($\sigma_{SIGNAL-CHAIN}$) based on the first system noise value ($\sigma_{SYS-0V}$) and the ADC noise value ($\sigma_{ADC}$). At 118, the processor 204 sets the test circuit signal source 250 to apply a non-zero full scale voltage signal to the signal chain 253 while the first and second ADC input terminals 272, 274 are connected to the signal chain 253. In some implementations, the applied non-zero signal is a sine wave. In other implementations, the applied non-zero signal is a non-sinusoidal alternating waveform. In some examples the non-zero signal is a full scale alternating signal. At 120, the processor 204 actuates the ADC 260 to sample and convert the differential, single-ended or pseudo-differential input signal INP, INM while the test circuit signal source 250 applies the full scale wave voltage signal to the signal chain 253, and receives a corresponding third set of data values from the ADC 260. At 122, the processor 204 computes a measured signal to noise ratio (SNR) value ($SNR_{MEASURED}$) based on the third set of data values. At 124, the processor 204 computes a second system noise value ($\sigma_{SYS-FS}$) based on the measured SNR value ($SNR_{MEASURED}$). At 126, the processor 204 computes an ADC SNR value ($SNR_{ADC}$) that represents a noise performance of the ADC (260) based on the second system noise value ($\sigma_{SYS-FS}$) and the signal chain noise value ($\sigma_{SIGNAL-CHAIN}$).

Figure 3:
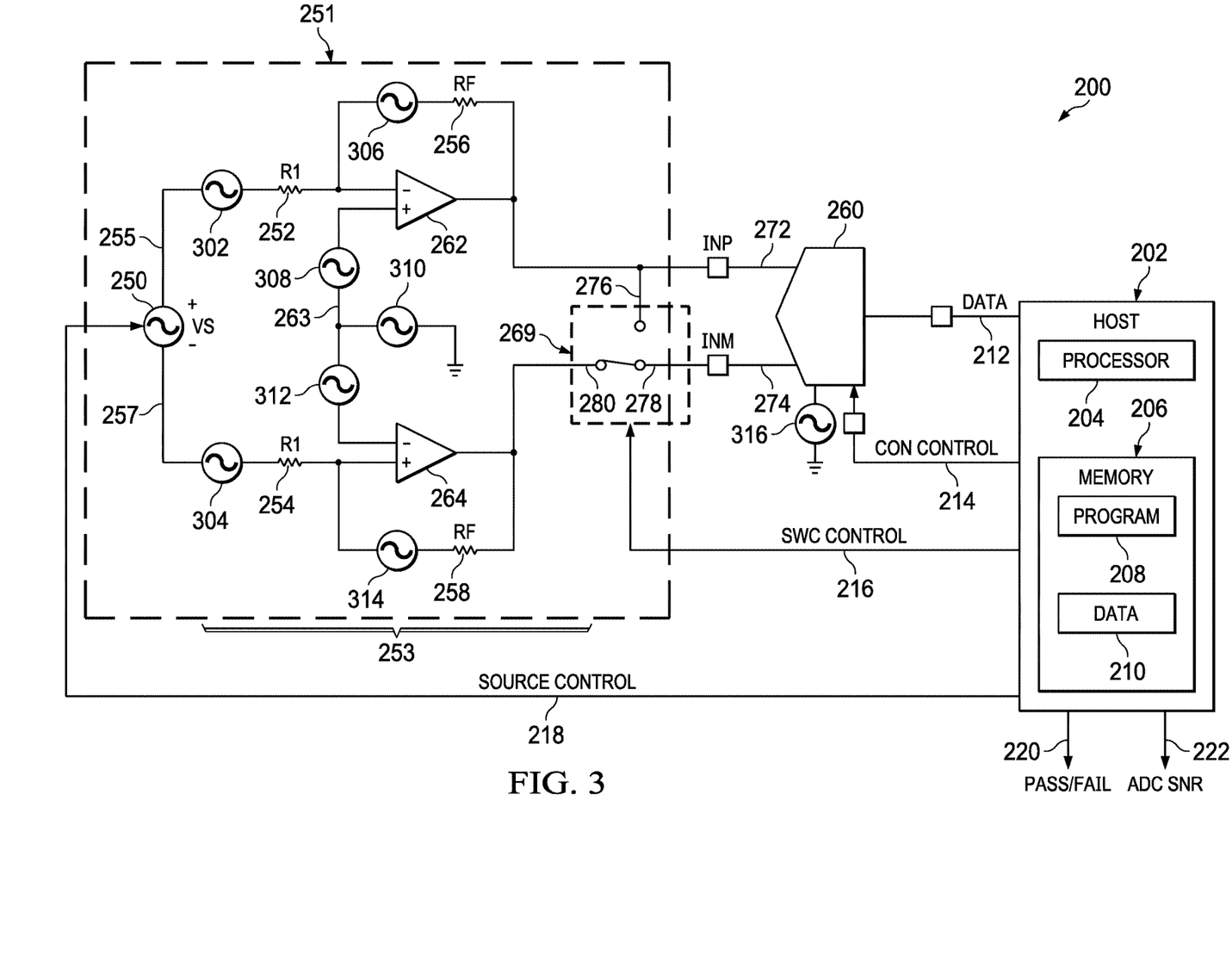
FIG. 3 is a schematic diagram of an automated test system including an illustration of signal chain noise.

Referring also to FIG. 3, as mentioned above, the signal chain circuit 253 has noise sources, and the process 100 accounts for these noise source when testing the ADC 260. FIG. 3 is a schematic diagram of the automated test system 200 including an illustrative example of the signal chain noise components or sources. In certain implementations, many of the components of the system 200 will have an associated noise. The example of FIG. 3 shows first resistor noise representation 302, second resistor noise representation 304, third resistor noise representation 306, first op-amp noise representation 308, common mode noise representation 310, second op-amp noise representation 312, fourth resistor noise representation 314, and ADC noise representation 316.

The illustrated system 200 measures 'device limited' SNR and linearity of ADC 260. In one example, a pass/fail criterion for a given tested ADC 260 is expressed in terms of signal-to-noise ratio and integral non-linearity (e.g., an expected device performance of 105 dB SNR and +/−1 ppm integral non linearity (INL)). To accurately verify whether or not a given ADC 260 meets this example performance, the test system must have greater than 22 bit linearity and greater than 120 dB SNR. In such a system, the measured ADC performance will accurately reflect the capabilities of the tested ADC 260. For an example 105 dB device SNR, the voltage noise density of the signal chain 253 should be less than 1 nV/√Hz over a bandwidth of 5 MHz. As discussed above, however, it is not practical to achieve a 22 bit linear source with less than 1 nV/√Hz noise in a single test circuit, and the maximum measurable test circuit SNR is limited by the driving op-amps.

DC input applications for ADCs 260 often require maximum SNR from device. For AC input applications, distortion is an important performance criteria. The illustrated method 100 and the example test system 200 facilitate use of a single test circuit to accurately characterize ADC SNR and INL in a single insertion. Compared with prior techniques, this advantageously reduces test time and cost for producing ADCs 260. Moreover, the illustrated techniques and systems accommodate the inherent trade-off between SNR and linearity, while facilitating accurate characterization of both SNR and INL in a single test insertion. The ADC 260 has an input sample and hold circuit (not shown). After conversion, a charged capacitor in the hold circuit of the ADC 260, is connected to the differently charged capacitor 270. This causes a 'kick-back' effect which is partly absorbed by the capacitor 270. Remaining charge is provided by a driving amplifier and the inputs ideally settle within the acquisition phase for high bandwidth performance. Noise from the op-amps 262, 264 and the test circuit signal source 250 will integrate over this high bandwidth, and accordingly there is a trade-off between faster settling (e.g., low INL) and low noise (SNR). The signal chain bandwidth has an impact on the type of performance parameter being tested. Specifically, a low bandwidth test circuit is preferred for testing ADC noise (SNR), whereas a high signal chain bandwidth is beneficial for testing the INL of the ADC 260. For noise measurements, op-amp white noise (voltage noise and current noise) integrates over the bandwidth of the driver amplifier stage. Also, the total input referred noise of the op-amps, which are capable of driving a switched capacitor load such as the ADC 260, is typically 5 nV/√Hz, and the SNR is inversely proportional to system bandwidth. The total integrated RMS noise of the signal chain is given by: Total input referred noise x $\sqrt{\text{bandwidth}}V_{RMS}$.

Conversely, a high signal chain bandwidth is beneficial for 'kick-back' settling (fast settling time), and hence for properly characterizing the INL of the ADC 260. The kick-back caused by the input sampling capacitor of the ADC 260 (not shown in FIG. 2) must be settled within the acquisition time for good INL testing, as the settling time is inversely proportional to the driver stage bandwidth and higher bandwidth corresponds to a lower (i.e., faster) settling time. For instance, for 20 bit settling, 14 time-constants are required for a sine input. For an example amplified bandwidth of 5 MHz, one time constant is 20 ns and the total settling time is 14×20 ns=280 ns. Hence, settling (in effect distortion) of the system is directly proportional to system bandwidth.

As mentioned above, prior systems had the drawback that two insertions of an ADC were required. The first insertion was to a circuit with a low noise topology. In this topology, a high input common mode variation resulted in distortion limited by the common-mode rejection ratio (CMRR) of the op-amp. This test circuit topology had a poor INL, and a high SNR. The second insertion had a linear topology (rather than a low noise topology). This topology, had no common mode variation, which ensured lowest possible distortion on account of op-amps. This test circuit had poor SNR because the op-amp noise is multiplied by a non-inverting gain.

Figure 4:
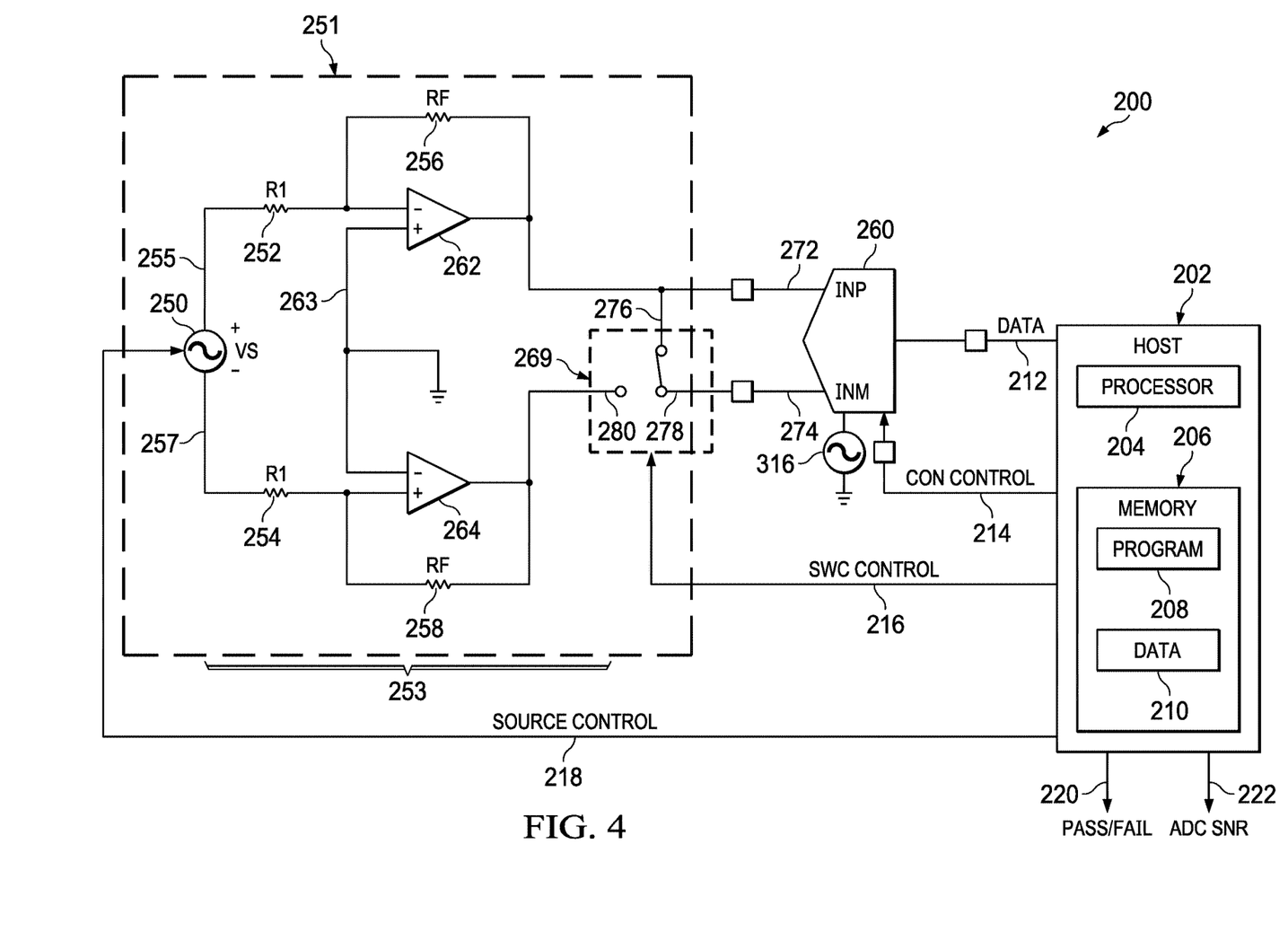
FIG. 4 is a schematic diagram of an automated test system with the switch in the first state.

In contrast, the example systems 200 and methods 100 advantageously allow for a single insertion solution, for example, by using a high bandwidth signal chain and calibrating system noise in accordance with the multiple test modes described herein. In operation, the host system 202 provides the SWC CONTROL 216 to place the switch 269 in a state according to a current test mode. In the example of FIG. 4, the switch is in the first state and the system 200 is in the first test mode. In certain implementations, the use of the two switch states and multiple test modes advantageously allows an ADC 260 to be successfully tested with only one insertion.

Figure 5:
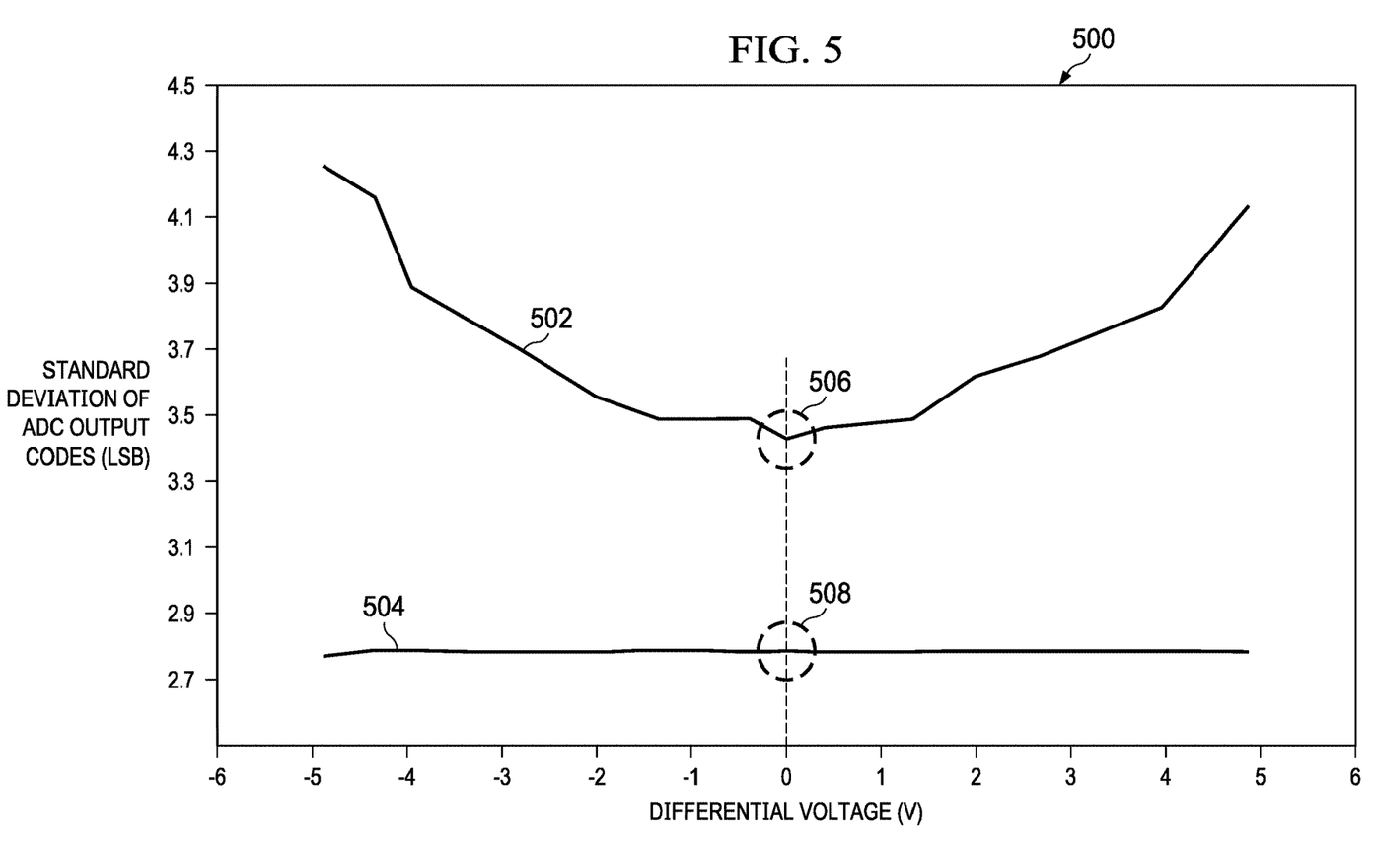
FIG. 5 is a graph showing noise profile vs. input voltage.

Referring also to a graph 500 in FIG. 5, the total noise seen in the output codes of the ADC 260 is root-sum-square of individual noise sources. Common mode noise is rejected by the CMRR of the ADC 260. Among all the mentioned noise sources, only $V_{noiseADC}$ is of interest in characterizing ADCs 260 in a manufacturing test application. The process or method 100 in FIG. 1 accurately computes the device SNR value and $V_{noiseADC}$ by effectively calibrating the test circuit noise sources using the ADC 260 currently connected to the test system 200. FIG. 5 shows noise profile vs. input voltage (e.g. shows standard deviation of ADC output codes (LSB) vs. differential voltage). The graph 500 of FIG. 5 includes an ADC noise curve 502 and an op-amp noise curve 504, shown as a function of differential input voltage. In this example, the ADC noise 502 increases as the differential input voltage tends towards full scale voltage. Conversely, the op-amp noise 504 is independent of the applied input voltage. If the op-amp noise 504 is known at any DC voltage, it can be used to calibrate a noise floor of the ADC 260 at any input voltage. At 0V input, the ADC 260 has no dependence on reference voltage, and hence reference artifacts are not calibrated out. In FIG. 5, point 506 illustrates the ADC noise at 0V (e.g., measured in the first mode of the method 100 at 104-108), and point 508 illustrates the op-amp noise at 0V (e.g., measured in the second test mode at 110-114 in FIG. 1).

In this example, because ADC noise is a function of the applied input voltage, the two measurements for $\sigma_{ADC}$ and $\sigma_{SYS}$ are done under the same differential input voltage (e.g., at 0V). As $\sigma_{ADC}$ varies with input, $\sigma_{ADC}$ cannot be directly used for computing the SNR of the ADC 260. Accordingly, the method 100 computes the system noise $\sigma_{signal-chain}$ independent of applied input voltage. The illustrated method 100 subtracts this noise source from the $SNR_{MEASURED}$ noise floor to compute the value $SNR_{ADC}$. The resulting computed value $SNR_{ADC}$ has all the information regarding ADC 260 noise variation with input to correctly characterize the performance of the ADC 260 under test.

In the first test mode, the system measures the noise of the ADC 260. FIG. 4 illustrates an example of the system configuration in the first test mode. In one implementation of the first test mode, all noise sources external to ADC are attenuated by the CMRR of the ADC 260. In this configuration, the processor 204 captures the data from the ADC 260 and computes its standard deviation $\sigma_{ADC}$ (e.g., 106, 108 in FIG. 1). The converted codes of ADC 260 correspond to 0 V differential input (e.g., because the switch 269 is shorting the first and second ADC input terminals 272 and 274). These codes have a code spread caused by the intrinsic noise of the ADC 260 under test (e.g., quantization and thermal).

Figure 6:
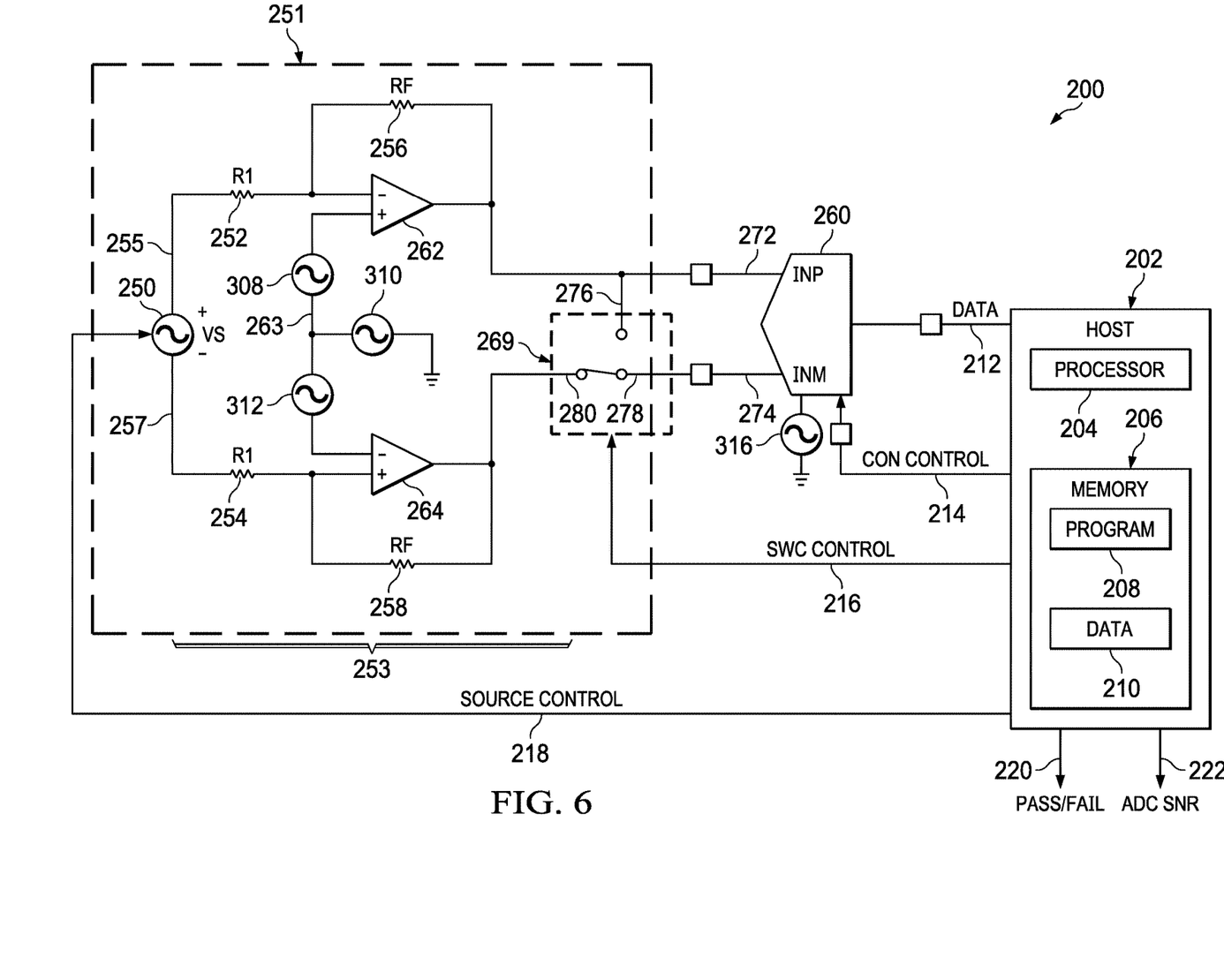
FIG. 6 is a schematic diagram of the automated test system with the switch in the second state.

In the second test mode, the processor 204 measures the system noise. FIG. 6 shows the system 200 with the switch circuit 269 in the second state, corresponding to the system operation in the second or third test modes. In one example, the system 200 applies a 0 V differential input from the test circuit signal source 250 through the input signal chain 253 (e.g., 110 in FIG. 1). The host system 202 captures data from the ADC 260 in this configuration, and computes the data's standard deviation $\sigma_{SYS}$ (e.g., 112, 114 in FIG. 1). The converted codes of ADC 260 correspond to 0 V differential input, with a code spread caused by noise from the ADC 260 and from the test circuit signal chain noise sources illustrated in FIG. 3.

The system noise $\sigma_{SYS}$ can be expressed as:

$$\sigma_{SYS} = \sqrt{\sigma_{ADC}^2 + \sigma_{op\text{-}amp}^2 + \sigma_{op\text{-}amp}^2 + \sigma_{source}^2}$$

The signal chain noise $\sigma_{signal-chain}$ can be computed by subtracting the ADC noise $\sigma_{ADC}$, from the system noise $\sigma_{SYS}$ as follows:

$$\sigma_{signal\text{-}chain} = \sqrt{\sigma_{SYS}^2 - \sigma_{ADC}^2},$$

$$\sigma_{signal\text{-}chain} = \sqrt{\sigma_{SYS}^2 + \sigma_{op\text{-}amp}^2 + \sigma_{op\text{-}amp}^2 + \sigma_{source}^2 - \sigma_{ADC}^2}, \text{ and}$$

$$\sigma_{signal\text{-}chain} = \sqrt{\sigma_{op\text{-}amp}^2 + \sigma_{op\text{-}amp}^2 + \sigma_{source}^2}.$$

In the third test mode, the switch 269 is still in the second state. In one implementation, the host system 202 causes the test circuit signal source 250 to apply a full scale sine wave to the input of the ADC 260 through the signal chain circuit 253, and the host system 202 computes the $SNR_{MEASURED}$ (e.g., 118, 120, 122 in FIG. 1) from the captured data. The captured data includes all noise sources (e.g., $\sigma_{SYS}$). The host system 202 then computes a second system noise value $\sigma_{SYS\text{-}FS}$, in one implementation, by solving the following equation:

$$SNR_{MEASURED} = 20*\log\left(\frac{\frac{ADC_{code-range}}{2\sqrt{2}}}{\sigma_{SYS-FS}}\right) dB.$$

The host system 202 removes the signal chain noise (as demonstrated in the equation below), and computes $SNR_{ADC}$ by solving the following equation.

$$SNR_{ADC} = 20*\log\left(\frac{\frac{ADC_{code-range}}{2\sqrt{2}}}{\sqrt{\sigma_{SYS-FS}^2 - \sigma_{signal-chain}^2}}\right) dB.$$

The above-described implementation reports true $ADC_{SNR}$ without system limitations in a signal path optimized for linearity (i.e., high bandwidth). In one example, the $ADC_{code-range}$ is a fixed value (e.g. $2^{20}$). To illustrate the effectiveness of the above-described procedure, 30 ADC devices were tested under the following conditions: (i) High bandwidth: Signal chain optimized for distortion; no noise calibration, (ii) Limited bandwidth: Signal chain optimized for noise; no noise calibration, and (iii) High bandwidth with calibration: Signal chain optimized for distortion; noise calibration implemented.

The results were as follows.

| Parameter | Low Distortion (first insertion of previous method) | Low Noise (second insertion of previous method) | Example of Above-Described Method (single insertion) |
| --- | --- | --- | --- |
| SNR (dBFS) | 100.2 | 104.5 | 104.4 |
| THD (dB) | −125 | −118 | −125 |
| INL (ppm) | ±1 | ±1.8 | ±1 |
| Test Time | 22 seconds + 12 seconds = 34 seconds | | 30 seconds |

As this shows, the example implementation described above allows to test the ADC 260 for linearity while still measuring true device SNR.

Also advantageously, certain implementations do not require high precision equipment. In some implementations, higher end equipment is not required, even for higher resolutions ADCs.

The above-described methods also improve quality of measurement, as parameters truly reflect device performance. It should also be noted that the ADC 260 is able to achieve simulation numbers using the above-described methods. The illustrated methods may be implemented in hardware, processor-executed software or processor-executed firmware, programmable logic, etc. or combinations thereof, and various embodiments or implementations include non-transitory computer readable mediums having computer-executable instructions for performing the illustrated and described methods. For example, an electronic memory (e.g., 206 in FIG. 2) can be used to store computer executable instructions (program 208) that are executed by the host processor 204 or more than one processor to implement the method of FIG. 1. The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The invention claimed is:

1. A method of testing an analog-to-digital converter (ADC), the ADC including an input with a first ADC input terminal, and a second ADC input terminal to receive an input signal, the method comprising:
   receiving, by a processor, a first set of data values sampled by the ADC while the first and second ADC input terminals are connected to one another;
   receiving, by the processor, a second set of data values sampled by the ADC while: (i) the first and second ADC input terminals are connected to a test circuit signal chain of a test circuit, and (ii) a test circuit signal source applies a zero volt source voltage signal to the test circuit signal chain;
   receiving, by the processor, a third set of data values sampled by the ADC while: (i) the first and second ADC input terminals are connected to the test circuit signal chain, and (ii) the test circuit signal source applies a full scale source voltage signal to the test circuit signal chain; and
   computing, by the processor, an ADC SNR value that represents a noise performance of the ADC based on the first set of data values, the second set of data values, and the third set of data values.

2. The method of claim 1, further comprising:
   actuating, by the processor, the test circuit to connect the first and second ADC input terminals to one another;
   actuating, by the processor, the ADC to sample the input signal while the first and second ADC input terminals are connected to one another, and receiving the first set of data values from the ADC;
   computing, by the processor, an ADC noise value based on the first set of data values;
   actuating, by the processor, the test circuit to connect the ADC input to a test circuit signal chain of the test circuit, and setting the test circuit signal source to apply a zero volt source voltage signal to the signal chain;
   actuating, by the processor, the ADC to sample the input signal while the test circuit signal source applies zero volts to the signal chain, and receiving the second set of data values from the ADC;
   computing, by the processor, a system noise value based on the second set of data values;
   computing, by the processor, a signal chain noise value based on the first system noise value and the ADC noise value;
   actuating, by the processor, the test circuit signal source to apply a non-zero full scale source voltage signal to the signal chain while the first and second ADC input terminals are connected to the signal chain;
   actuating, by the processor, the ADC to sample the input signal while the test circuit signal source applies the non-zero full scale source voltage signal to the signal chain, and receiving the third set of data values from the ADC;

computing, by the processor, a measured SNR value based on the third set of data values;

computing, by the processor, a second system noise value based on the measured SNR value; and computing, by the processor, the ADC SNR value based on the second system noise value and the signal chain noise value.

3. The method of claim 2,
wherein the ADC noise value is computed as a standard deviation of the first set of data values; and
wherein the first system noise value is computed as a standard deviation of the second set of data values.

4. The method of claim 2, wherein the second system noise value is computed based on using an ADC code range.

5. The method of claim 2, wherein the ADC SNR value is computed based on a square root of a difference between a square of the signal chain noise value and a square of the second system noise value.

6. The method of claim 2, wherein computing the measured SNR value includes performing a Fast Fourier Transform (FFT) on the third set of data values.

7. The method of claim 2, wherein the signal chain noise value is computed as a square root of a difference between a square of the ADC noise value and a square of the first system noise value.

8. An automated test system for testing a connected analog-to-digital converter (ADC), the ADC including an input with a first ADC input terminal, and a second ADC input terminal to receive an input signal, the system comprising:
  a test circuit, including:
    a test circuit signal source, including first and second signal source outputs to provide a source voltage signal according to a signal source control signal,
    a signal chain circuit, including:
      a signal chain input to receive the source voltage signal from the test circuit signal source, the signal chain input including a first signal chain input node connected to the first signal source output, and a second signal chain input node connected to the second signal source output, and
      a signal chain output to provide a signal chain output signal, the signal chain output including a first signal chain output node, and a second signal chain output node, and
    a switch circuit coupled with the signal chain output and with the input of the ADC, the switch circuit operative in a first state to connect the first and second ADC input terminals to one another, and in a second state to connect the signal chain output to the input of the ADC to provide the signal chain output signal to the first and second ADC input terminals; and
  a host system, including a processor configured to:
    in a first test mode, provide a switch control signal to place the switch circuit in the first state, provide a convert control signal to cause the ADC to sample the input signal while the switch circuit is in the first state, receive a corresponding first set of data values from the ADC, and compute an ADC noise value based on the first set of data values;
    in a second test mode, provide the switch control signal to place the switch circuit in the second state, provide the signal source control signal to cause the test circuit signal source to provide the source voltage signal to the signal chain circuit at zero volts, provide the convert control signal to cause the ADC to sample the input signal while the test circuit signal source provides the source voltage signal to the signal chain circuit at zero volts, receive a corresponding second set of data values from the ADC, and compute a first system noise value based on the second set of data values,
    compute a signal chain noise value based on the first system noise value and the ADC noise value,
    in a third test mode, provide the source control signal to cause the test circuit signal source to provide the source voltage signal to the signal chain circuit as a non-zero full scale voltage signal while the switch circuit is in the second state, provide the convert control signal to cause the ADC to sample the input signal while the test circuit signal source provides the source voltage signal to the signal chain circuit as the non-zero full scale voltage signal, receive a corresponding third set of data values from the ADC, and compute a measured signal to noise ratio (SNR) value based on the third set of data values,
    compute a second system noise value based on the measured SNR value, and
    compute an ADC SNR value that represents a noise performance of the ADC based on the second system noise value and the signal chain noise value.

9. The system of claim 8,
wherein the processor computes the ADC noise value as a standard deviation of the first set of data values; and
wherein the processor computes the first system noise value as a standard deviation of the second set of data values.

10. The system of claim 8, wherein the processor computes the second system noise value based on using an ADC code range.

11. The system of claim 8, wherein the processor computes the ADC SNR value based on a square root of a difference between a square of the signal chain noise value and a square of the second system noise value.

12. The system of claim 8, wherein the processor computes the measured SNR value by performing a Fast Fourier Transform on the third set of data values.

13. The system of claim 8, wherein the processor computes the signal chain noise value as a square root of a difference between a square of the ADC noise value and a square of the first system noise value.

14. A method of individually testing a plurality of analog-to-digital converters (ADCs), the individual ADCs including an input with a first ADC input terminal, and a second ADC input terminal to receive an input signal, the method comprising, for each individual one of a plurality of ADCs:
  connecting the first and second ADC input terminals to one another;
  computing, by a processor, an ADC noise value based on a first set of data values corresponding to the ADC sampling the input signal while the first and second ADC input terminals are connected to one another;
  connecting the first and second ADC input terminals to a test circuit signal chain, and setting a test circuit signal source to apply a zero volts source voltage signal to the signal chain;
  computing, by the processor, a first system noise value based on a second set of data values corresponding to the ADC sampling the input signal while the test circuit signal source applies the zero volt source voltage signal to the signal chain;

computing, by the processor, a signal chain noise value based on the first system noise value and the ADC noise value;

setting the test circuit signal source to apply a non-zero voltage signal to the signal chain;

computing, by the processor, a measured signal to noise ratio (SNR) value based on a third set of data values corresponding to the ADC sampling the input signal while the test circuit signal source applies the non-zero voltage signal to the signal chain;

computing, by the processor, a second system noise value based on the measured SNR value; and computing, by the processor, an ADC SNR value that represents a noise performance of the ADC based on the second system noise value and the signal chain noise value.

15. The method of claim 14, wherein the non-zero voltage signal is a full scale sine wave voltage signal.

16. The method of claim 14,
wherein the ADC noise value is computed as a standard deviation of the first set of data values; and
wherein the first system noise value is computed as a standard deviation of the second set of data values.

17. The method of claim 14, wherein the second system noise value is computed based on using an ADC code range.

18. The method of claim 14, wherein the ADC SNR value is computed based on a square root of a difference between a square of the signal chain noise value and a square of the second system noise value.

19. The method of claim 14, wherein computing the measured SNR value includes performing a Fast Fourier Transform (FFT) on the third set of data values.

20. The method of claim 14, wherein the signal chain noise value is computed as a square root of a difference between a square of the ADC noise value and a square of the first system noise value.

* * * * *